(12) United States Patent
Kim et al.

(10) Patent No.: US 10,276,643 B2
(45) Date of Patent: Apr. 30, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Jeong-Oh Kim, Goyang-si (KR); Jung-Sun Beak, Paju-si (KR); Jong-Won Lee, Seoul (KR); Dong-Kyu Lee, Gunsan-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/798,517

(22) Filed: Oct. 31, 2017

(65) Prior Publication Data

US 2018/0122886 A1 May 3, 2018

(30) Foreign Application Priority Data

Oct. 31, 2016 (KR) .......................... 10-2016-0143976

(51) Int. Cl.
*H01L 27/32* (2006.01)
*H01L 51/56* (2006.01)
*H01L 49/02* (2006.01)
*H01L 27/12* (2006.01)

(52) U.S. Cl.
CPC .......... *H01L 27/3265* (2013.01); *H01L 27/12* (2013.01); *H01L 27/3262* (2013.01); *H01L 27/3276* (2013.01); *H01L 28/60* (2013.01); *H01L 51/56* (2013.01); *H01L 2227/323* (2013.01)

(58) Field of Classification Search
CPC .................................. H01L 27/3244–27/3279
See application file for complete search history.

(56) References Cited

U.S. PATENT DOCUMENTS

| | | | |
|---|---|---|---|
| 2015/0206929 A1* | 7/2015 | Sato | H01L 27/32 257/40 |
| 2016/0141344 A1 | 5/2016 | Sato | |
| 2017/0155082 A1* | 6/2017 | Mu | H01L 27/3244 |
| 2017/0288002 A1* | 10/2017 | Kim | G09G 3/3233 |

FOREIGN PATENT DOCUMENTS

| | | |
|---|---|---|
| JP | 2003-152086 A | 5/2003 |
| KR | 10-2015-0086188 A | 7/2015 |
| KR | 10-2016-0092826 A | 8/2016 |

OTHER PUBLICATIONS

Office Action issued in counterpart Korean Patent Application No. 10-2016-0143976 dated May 17, 2018.

* cited by examiner

*Primary Examiner* — Daniel P Shook
(74) *Attorney, Agent, or Firm* — Morgan, Lewis & Bockius LLP (57) ABSTRACT

Disclosed are an organic light emitting display device which may implement high resolution and a method of manufacturing the same. A storage capacitor disposed on a substrate overlaps a plurality of transistors connected to a light emitting element with at least one buffer layer including an organic buffer layer interposed therebetween and, thus, a sufficient process margin may be assured, high resolution may be implemented and yield may be improved.

12 Claims, 13 Drawing Sheets

FIG. 1

Related Art

ORGANIC LIGHT EMITTING DISPLAY DEVICE AND METHOD OF MANUFACTURING THE SAME

This application claims the benefit of Korean Patent Application No. 10-2016-0143976, filed on Oct. 31, 2016, which is hereby incorporated by reference as if fully set forth herein.

BACKGROUND

Technical Field

The present invention relates to an organic light emitting display device and a method of manufacturing the same, and more particularly, to an organic light emitting display device which may implement high resolution and a method of manufacturing the same.

Discussion of the Related Art

Display devices, which display various pieces of information on a screen, are a core technology in the age of information and communication and have been developed to satisfy thinness, light-weight, portability and high-performance trends. Therefore, as a flat panel display which can reduce weight and volume to make up for drawbacks of a cathode ray tube (CRT), an organic light emitting display device, which controls the amount of light emitted from an organic light emitting layer and thus displays an image, is now spotlighted. Such an organic light emitting display device is a self-luminous display and has advantages, such as low power consumption, high response speed, high luminous efficacy, high brightness and wide viewing angle.

Such an organic light emitting display device displays an image through a plurality of sub-pixels arranged in a matrix. Each of the sub-pixels includes a light emitting element and a pixel circuit including a plurality of transistors to independently drive the light emitting element.

Figure 1:
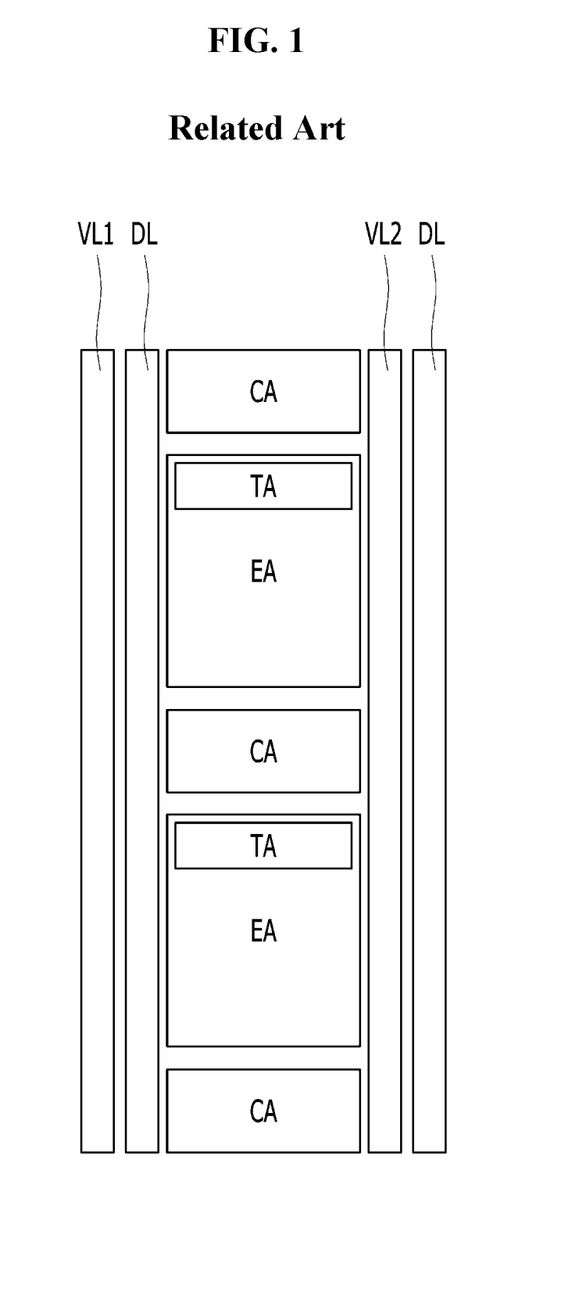
FIG. 1 is a plan view illustrating arrangement relations among a transistor area, a capacitor area and an emission area of a conventional organic light emitting display device.

Here, the light emitting element is formed on the transistors of the pixel circuit separately from the transistors through a separate mask process. Therefore, an emission area EA, in which the light emitting element is disposed, vertically overlaps a transistor area TA, in which the transistors are disposed, as exemplarily shown in FIG. 1. However, a storage capacitor included in the pixel circuit is formed to be coplanar with the transistors through the same mask process as the transistors. Therefore, a capacitor area CA, in which the storage capacitor is disposed, does not overlap the transistor area TA and is spaced from the transistor area TA in the horizontal direction. Further, signal lines connected to the transistors, for example, data lines DL, a high voltage (VDD) supply line VL1 and a low voltage (VSS) supply line VL2 are arranged to be spaced apart from each other in the horizontal direction in consideration of influence of a parasitic capacitor. Since the signal lines DL, VL1 and VL2, the transistor area TA and the capacitor area CA should be arranged to be spaced apart from one another in the horizontal direction on a substrate, it may be difficult to implement high resolution due to an insufficient process margin and yield may be lowered.

SUMMARY

Accordingly, the present invention is directed to an organic light emitting display device and a method of manufacturing the same that substantially obviate one or more problems due to limitations and disadvantages of the related art.

An object of the present invention is to provide an organic light emitting display device which may implement high resolution and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises storage capacitors disposed on a substrate, at least one buffer layer disposed on the storage capacitors, a plurality of transistors overlapping each of the storage capacitors with the at least one buffer layer interposed therebetween, and light emitting elements connected to the transistors.

In another aspect, a method of manufacturing an organic light emitting display device includes forming storage capacitors disposed on a substrate, forming at least one buffer layer disposed on the storage capacitors, forming a plurality of transistors overlapping each of the storage capacitors with the at least one buffer layer interposed therebetween, and forming light emitting elements connected to the transistors.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to the preferred embodiments of the present invention, examples of which are illustrated in the accompanying drawings.

Figure 2:
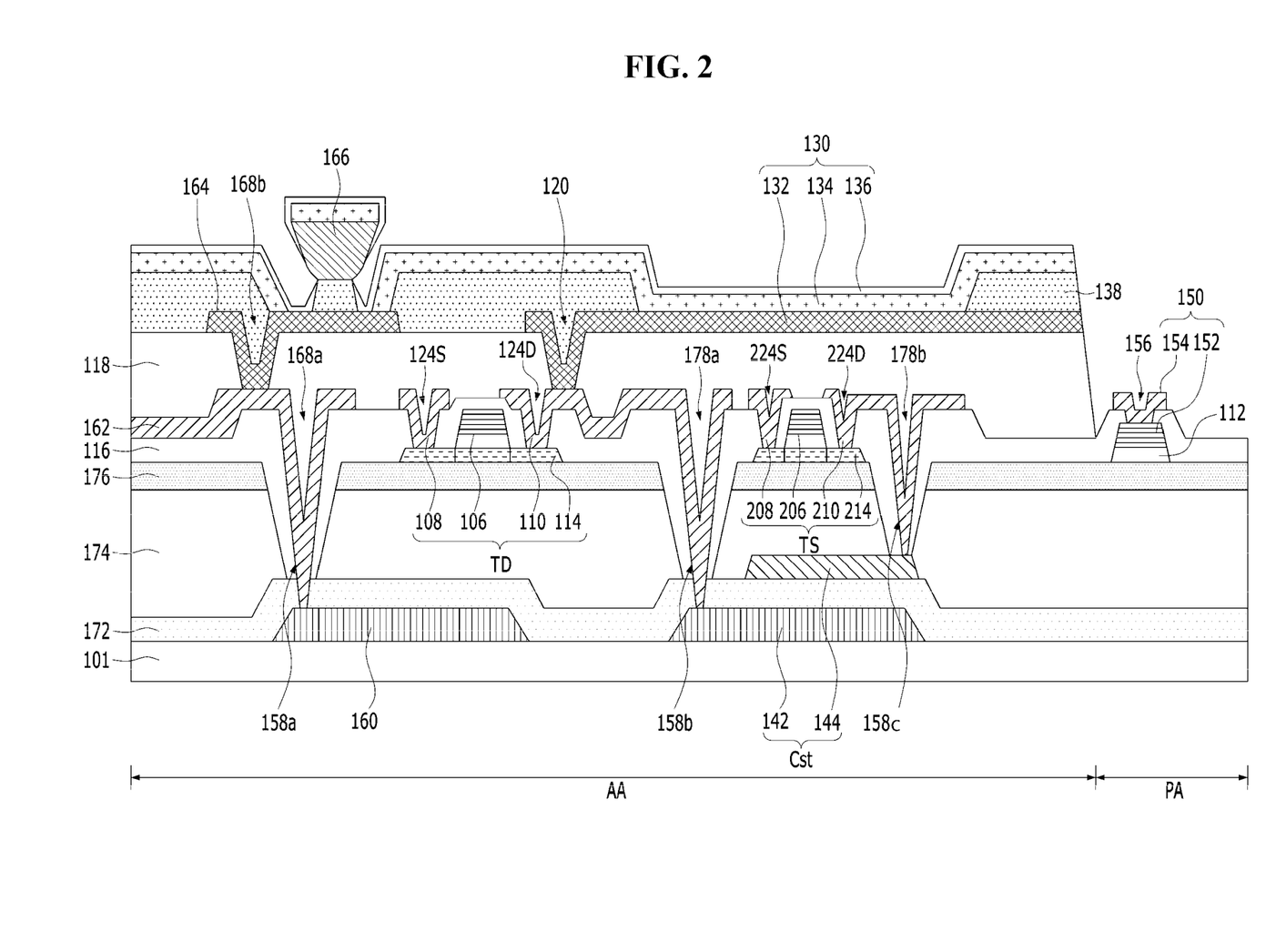
FIG. 2 is a cross-sectional view of an organic light emitting display device in accordance with the present invention.

FIG. 2 is a cross-sectional view of an organic light emitting display device in accordance with the present invention.

The organic light emitting display device shown in FIG. 2 is provided with an active area AA and a pad area PA.

In the pad area PA, a plurality of pads 150 to respectively supply driving signals to scan lines, data lines, a high voltage (VDD) supply line and a low voltage (VSS) supply line 160 disposed in the active area AA is formed.

Each of the pads 150 includes a pad electrode 152 and a pad cover electrode 154.

The pad electrode 152 is formed of the same material as gate electrodes 206 and 106 on a gate insulating pattern 112 having the same shape as the pad electrode 152.

The pad cover electrode 154 is conductively connected to the pad electrode 152 exposed through a pad contact hole 156 formed through an interlayer insulating film 116. The pad cover electrode 154 is formed of the same material as source and drain electrodes 108, 208, 110 and 210 on an interlayer insulating film 116 to be coplanar with the source and drain electrodes 208, 108, 210 and 110.

In the active area AA, a plurality of sub-pixels is arranged in a matrix and thus an image is displayed. Each of the sub-pixels arranged in the active area includes a pixel driving circuit and a light emitting element 130 connected to the pixel driving circuit.

The pixel driving circuit includes a switching transistor TS, a driving transistor TD and a storage capacitor Cst.

The switching transistor TS is turned on when a scan pulse is supplied to the scan line, and supplies a data signal supplied to the data line to the storage capacitor Cst and a gate electrode 106 of the driving transistor TD.

The driving transistor TD controls current I supplied from the high voltage supply line to the light emitting element 130 in response to the data signal supplied to the gate electrode 106 of the driving transistor TD, thus adjusting an amount of light emitted from the light emitting element 130. Further, even if the switching transistor TS is turned off, the driving transistor TD supplies constant current I due to voltage charging the storage capacitor Cst until a data signal of a next frame is supplied, and thus maintains emission of light from the light emitting element 130.

The switching transistor TS and the driving transistor RD include the gate electrodes 206 and 106, the source electrodes 208 and 108, the drain electrodes 210 and 110 and active layers 214 and 114.

The gate electrodes 206 and 106 are formed on a gate insulating pattern 112 having the same shape as the gate electrodes 206 and 106. The gate electrodes 206 and 106 overlap channel regions of the active layers 214 and 114 with the gate insulating pattern 112 interposed therebetween. The gate electrodes 206 and 106 may have a single layer structure including one selected from the group consisting of molybdenum (Mo), aluminum (Al), chrome (Cr), gold (Au), titanium (Ti), nickel (Ni), neodymium (Nd) and copper (Cu) or an alloy thereof or have a multilayer structure including the same, but the present invention is not limited thereto.

Figure 3:
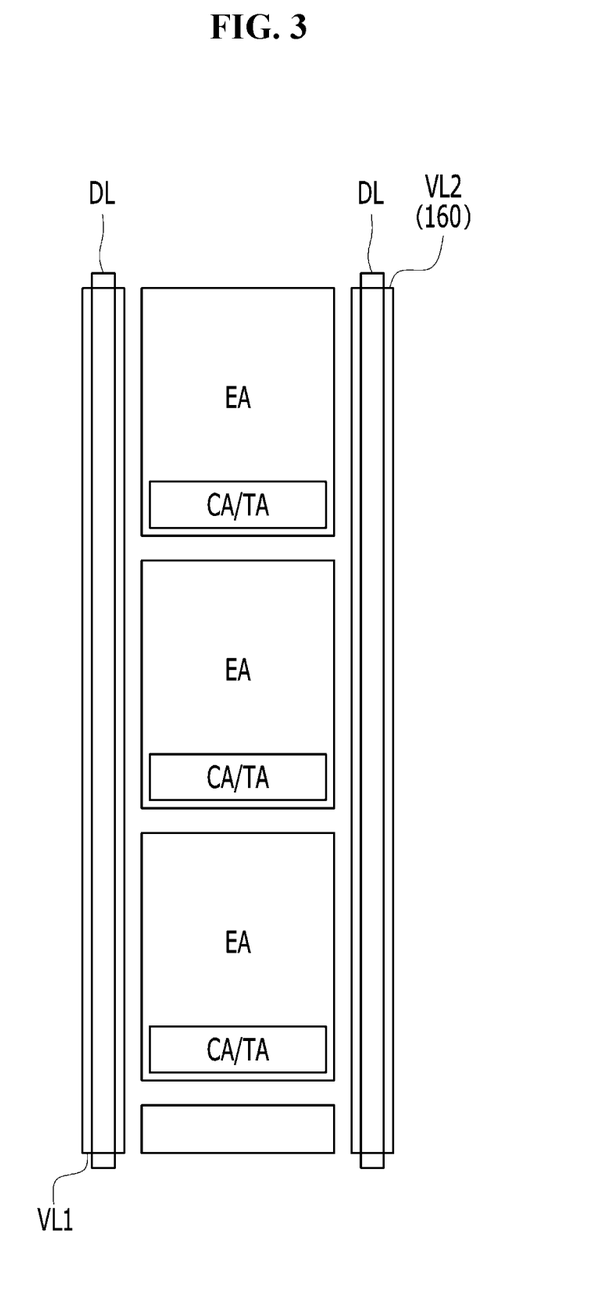
FIG. 3 is a plan view illustrating arrangement relations among a transistor area, a capacitor area and an emission area of the organic light emitting display device in accordance with the present invention.

The source electrodes 208 and 108 are connected to source regions of the active layers 214 and 114 through source contact holes 224S and 124S formed through the interlayer insulating film 116. Further, the data line connected to the source electrode 208 of the switching transistor TS is formed of the same material as the source electrode 208 simultaneously with formation of the source electrode. Such a data line DL is arranged in parallel with the low voltage supply line VL2 160 and the high voltage supply line VL1 disposed on a substrate 101, as exemplarily shown in FIG. 3. The data line DL vertically overlaps at least one of the low voltage supply line VL2 160, the high voltage supply line VL1 and the storage capacitor Cst with at least one buffer layer including an organic buffer layer 174 interposed therebetween.

The drain electrodes 210 and 110 are connected to drain regions of the active layers 214 and 114 through drain contact holes 224D and 124D formed through the interlayer insulating film 116. The drain electrode 210 of the switching transistor TS is connected to a storage upper electrode 144 exposed through a third open hole 158c and a second storage contact hole 178b formed through the interlayer insulating film 116. The drain electrode 110 of the driving transistor TD is exposed through a pixel contact hole 120 formed through a planarization layer 118 and is connected to an anode 132. Further, the drain electrode 110 of the driving transistor TD is connected to a storage lower electrode 142 exposed through a first storage contact hole 178a.

The source electrodes 208 and 108 and the drain electrodes 210 110 may have, for example, a single layer structure including one selected from the group consisting of molybdenum (Mo), aluminum (Al), chrome (Cr), gold (Au), titanium (Ti), nickel (Ni), neodymium (Nd) and copper (Cu) or an alloy thereof or have a multilayer structure including the same, but the present invention is not limited thereto.

The active layers 214 and 114 are provided with the source regions and the drain regions which are opposite each other across the channel regions interposed therebetween. The channel regions overlap the gate electrodes 206 and 106 with the gate insulating pattern 112 interposed therebetween. The source regions are connected to the source electrodes 208 and 108 through the source contact holes 224S and 124S, and the drain regions are connected to the drain electrodes 210 and 110 through the drain contact holes 224D and 124D. Each of the source regions and the drain regions are formed of a semiconductor material doped with an n-type or p-type impurity, and the channel regions are formed of a semiconductor material doped with no n-type or p-type impurity.

A first inorganic buffer layer 172, an organic buffer layer 174 and a second inorganic buffer layer 176 are sequentially stacked between the active layers 214 and 114 and the substrate 101.

The first inorganic buffer layer 172 is disposed on the substrate 101 provided with the low voltage supply line VL2 160 and the storage lower electrode 142. The first inorganic buffer layer 172 is formed of an inorganic insulating material, such as $SiO_x$, $SiN_x$ or SiON, between each of the low voltage supply line 160 and storage lower electrode 142 and the organic buffer layer 174. The first inorganic buffer layer 172 prevents diffusion of moisture or impurities generated from the substrate 101 to the switching and driving transistors TS and TD.

The organic buffer layer 174 is formed of a material having lower permittivity and higher heat resistance than the first and second inorganic buffer layers 172 and 176, on the first inorganic buffer layer 172. For example, the organic buffer layer 174 is formed of an organic material, such as an acrylic resin or an epoxy resin. The organic buffer layer 174 is formed between each of the active layers 214 and 114 of the switching and driving thin film transistors TS and TD and at least one signal line of the scan lines, the data lines, the high voltage supply line and the low voltage supply line 160. Further, the organic buffer layer 174 is formed between a first auxiliary connection electrode 162 and the low voltage supply line 160. Therefore, the capacitance of a parasitic capacitor formed between at least one signal line of the scan lines, the data lines, the high voltage supply line and the low voltage supply line 160 disposed on the substrate 101 and each of the components of the switching and driving thin film transistors TS and TD and the auxiliary connection electrode 162 is decreased in direct proportion to permittivity of the organic buffer layer 174 and in inverse proportion to the thickness of the organic buffer layer 174. Thus, even if each of the components of the switching and driving thin film transistors TS and TD and the auxiliary connection electrode 162 and the signal lines DL, VL1 and VL2 disposed on the substrate 101 overlap each other, signal interference therebetween may be minimized.

Further, the organic buffer layer 174 is formed to have first to third open holes 158a, 158b and 158c. The first open hole 158a is formed through the organic buffer layer 174 and the second inorganic buffer layer 176 to have a greater width than a first auxiliary contact hole 168a. Therefore, it is easy to form the first auxiliary contact hole 168a through the first organic buffer layer 172 and the interlayer insulating film 116 within the first open hole 158a. The second open hole 158b is formed through the organic buffer layer 174 and the second inorganic butter layer 176 to have a greater width than the first storage contact hole 178a. Therefore, it is easy to form the first storage contact hole 178a through the first inorganic buffer layer 172 and the interlayer insulating film 116 within the second open hole 158b. The third open hole 158c is formed through the organic buffer layer 174 and the second inorganic butter layer 176 to have a greater width than the second storage contact hole 178b. Therefore, it is easy to form the second storage contact hole 178b through the interlayer insulating film 116 within the third open hole 158c.

The second inorganic buffer layer 176 is formed of an inorganic insulating material, such as $SiO_x$, $SiN_x$ or SiON, in the same manner as the first inorganic buffer layer 172. The second inorganic buffer layer 176 is formed on the organic buffer layer 174 to have the same line width as the organic buffer layer 174, and blocks fumes generated from the upper surface of the organic buffer layer 174. The interlayer insulating film 116 is formed of $SiO_x$, $SiN_x$ or SiON, on the side surfaces of the organic buffer layer 174 exposed by the first to third open holes 158a, 158b and 158c, thus blocking fumes generated from the side surfaces of the organic buffer layer 174. Therefore, the switching and driving transistors TS and TD may be prevented from deteriorating due to fumes generated from the upper and side surfaces of the organic buffer layer 174.

The storage capacitor Cst is formed by overlapping the storage lower electrode 142 and the storage upper electrode 144 while interposing the first inorganic butter layer 172 therebetween. Here, the storage lower electrode 142 is formed of the same material as the low voltage supply line 160 in the same layer as the low voltage supply line 160, exposed through the first storage contact hole 178a and connected to the drain electrode 110 of the driving transistor TD. Further, the storage upper electrode 144 is exposed through the second storage contact hole 178b and connected to the drain electrode 210 of the switching transistor TS. Even if the switching transistor TS is turned off, the driving transistor TD supplies constant current I due to voltage charging the storage capacitor Cst until a data signal of a next frame is supplied, and thus maintains emission of light from the light emitting element 130.

Further, the storage lower electrode 142 and the low voltage supply line 160 are formed of an opaque metal, such as Mo, Ti, Al, Cu, Cr, Co, W, Ta or Ni, and overlap with the active layers 214 and 114 of the switching and driving transistors TS and TD. Therefore, the storage lower electrode 142 and the low voltage supply line 160 absorb or reflect light incident from the outside and may thus prevent external light from being incident upon the channel regions of the active layers 214 and 114 of the switching and driving transistors TS and TD.

The light emitting element 130 includes the anode 132 connected to the drain electrode 110 of the driving transistor TD, at least one light emitting stack 134 formed on the anode 132, and a cathode 136 formed on the light emitting stack 134.

The anode 132 is disposed on the planarization layer 118 and is exposed by a bank 138. The anode 132 is conductively connected to the drain electrode 110 of the driving transistor TD exposed through the pixel contact hole 120. The anode 132 is formed to have a multilayer structure including a transparent conductive film and an opaque conductive film having high reflection efficiency, in the same manner as an auxiliary connection electrode 168. The transparent conductive film is formed of a material having a comparatively high work function value, such as indium-tin-oxide (ITO) or indium-zinc-oxide (IZO), and the opaque conductive film is formed to have a single layer structure or a multilayer structure including Al, Ag, Cu, Pb, Mo, Ti or an alloy thereof. For example, the anode 132 may be formed to have a structure in which a transparent conductive film, an opaque conductive film and a transparent conductive film are sequentially stacked, or a structure in which a transparent conductive film and an opaque conductive film are sequentially stacked.

The light emitting stack 134 is formed by stacking a hole related layer, an organic light emitting layer and an electron related layer on the anode 132 in regular order or in reverse order. The light emitting stack 134 may include first and second light emitting stacks disposed opposite each other with a charge generation layer interposed therebetween. In this case, an organic light emitting layer of one of the first and second light emitting stacks generates blue light, and an organic light emitting layer of the other of the first and second light emitting stacks generates yellowish green light, thus producing white light through the first and second light emitting stacks.

The bank 138 is formed to expose the anode 132 and a second auxiliary connection electrode 164. The bank 138 may be formed of an opaque material (for example, a black material) to prevent optical interference between neighboring sub-pixels. In this case, the bank 138 may be formed of a light-shielding material including at least one of a color pigment, an organic black pigment and carbon.

A diaphragm 166 serves to separate light emitting stacks 134 disposed in neighboring sub-pixels emitting light of different colors from each other. For this purpose, the diaphragm 166 has a reverse tapered shape on the bank 138 disposed on the second auxiliary connection electrode 164. That is, the reverse tapered diaphragm 166 has a width which is gradually increased from the lower surface thereof to the upper surface thereof.

Since the light emitting stack 134 grown to have straightness is not formed on the second auxiliary connection electrode 164 overlapping the tapered diaphragm 166, the light emitting stacks 134 of the neighboring sub-pixels emitting light of different colors are separated from each other on the second auxiliary connection electrode 164 by the diaphragm 166. In this case, the light emitting stack 134 is formed only on the upper surface of the anode 132 exposed by the bank 138, the upper surface of the diaphragm 166 and the upper and side surfaces of the bank 138. On the other hand, the cathode 136 having better step coverage than the light emitting stack 134 is formed on the upper and side surfaces of the diaphragm 166 and the side surface of the bank 138 disposed under the diaphragm 166 and thus contact between the cathode 136 and the second auxiliary connection electrode 164 is facilitated.

The cathode 136 is formed on the upper and side surfaces of the light emitting stack 134 and the bank 138 to be opposite the anode 132 with the light emitting stack 134 interposed therebetween. If the cathode 136 is applied to a front view type organic light emitting display device, the cathode 136 is formed of a transparent conductive film, such as indium-tin-oxide (ITO) or indium-zinc-oxide (IZO).

The cathode 136 is connected to the low voltage supply line 160 through the first and second auxiliary connection electrodes 162 and 164.

The low voltage supply line 160 overlaps the driving transistor TD with the first inorganic buffer layer 172, the organic buffer layer 174 and the second inorganic buffer layer 176 interposed therebetween. The low voltage supply line 160 is formed of the same material as the storage lower electrode 142, on the substrate 101.

The first auxiliary connection electrode 162 is conductively connected to the low voltage supply line 160 exposed through the first auxiliary contact hole 168a formed through the interlayer insulating film 116. The first auxiliary connection electrode 162 is formed of the same material as the source and drain electrodes 208, 108, 210 and 110, on the interlayer insulating film 116 to be coplanar with the source and drain electrodes 208, 108, 210 and 110.

The second auxiliary connection electrode 164 is conductively connected to the first auxiliary connection electrode 162 exposed through the second auxiliary contact hole 168b formed through the planarization layer 118. The second auxiliary connection electrode 164 is formed of the same material as the anode 132, on the planarization layer 118 to be coplanar with the anode 132.

The low voltage supply line 160 and the first and second auxiliary connection electrodes 162 and 164 are formed of a metal having higher conductivity than the cathode 136 and may thus compensate for high resistance of the cathode 136 formed of a transparent conductive film, such as indium-tin-oxide (ITO) or indium-zinc-oxide (IZO).

As such, the switching transistor TS in accordance with the present invention, as exemplarily shown in FIG. 2, vertically overlaps one of the low voltage supply line 160 and the storage capacitor Cst with at least one buffer layer including the organic buffer layer 174 interposed therebetween, and the driving transistor TD overlaps the other of the low voltage supply line 160 and the storage capacitor Cst at least one of the buffer layers 172, 174 and 176 interposed therebetween. Therefore, since the capacitor area CA, in which the storage capacitor Cst is disposed, overlaps the emission area EA and the transistor area TA, as exemplarily shown in FIG. 3, a process margin may be sufficiently assured and, thus, high resolution may be implemented and yield may be improved. Further, the data line DL vertically overlaps at least one of the high voltage supply line VL1 and the low voltage supply line VL2 160 with at least one buffer layer including the organic buffer layer 174 interposed therebetween, as exemplarily shown in FIG. 3. Therefore, the organic light emitting display device in accordance with the present invention may assure a sufficient process margin, thus implementing high resolution and improving yield.

FIGS. 4A to 4K are cross-sectional views illustrating a method of manufacturing the organic light emitting display device shown in FIG. 2.

Figure 4A:
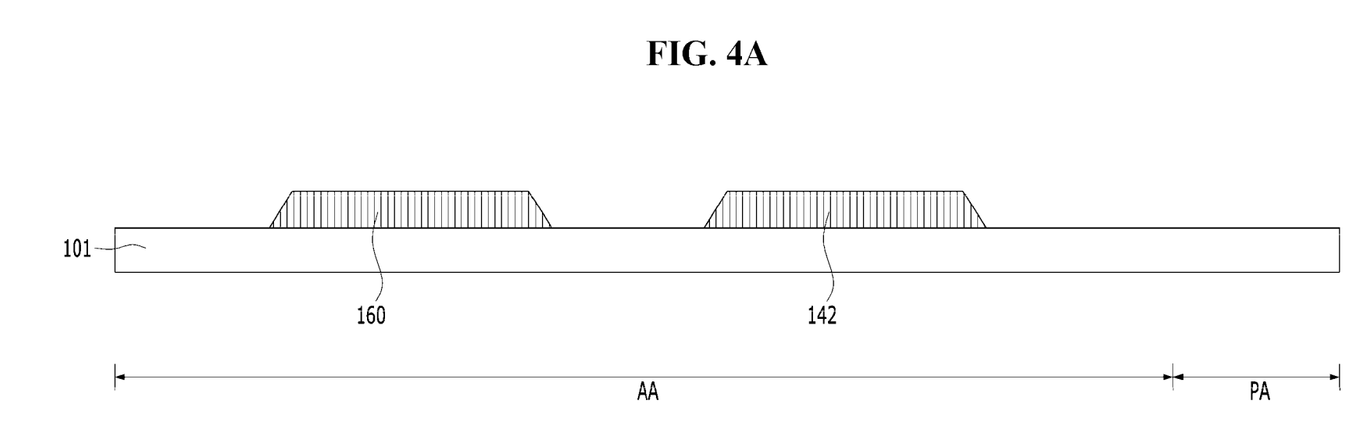
FIGS. 4A to 4K are cross-sectional views illustrating a method of manufacturing the organic light emitting display device shown in FIG. 2.

With reference to FIG. 4A, a storage lower electrode 142 and a low voltage supply line 160 are formed on a substrate 101.

In more detail, a first conductive layer is deposited on the entire surface of the substrate 101 and is then patterned through a photolithography process and an etching process, thus forming the storage lower electrode 142 and the low voltage supply line 160.

Figure 4B:
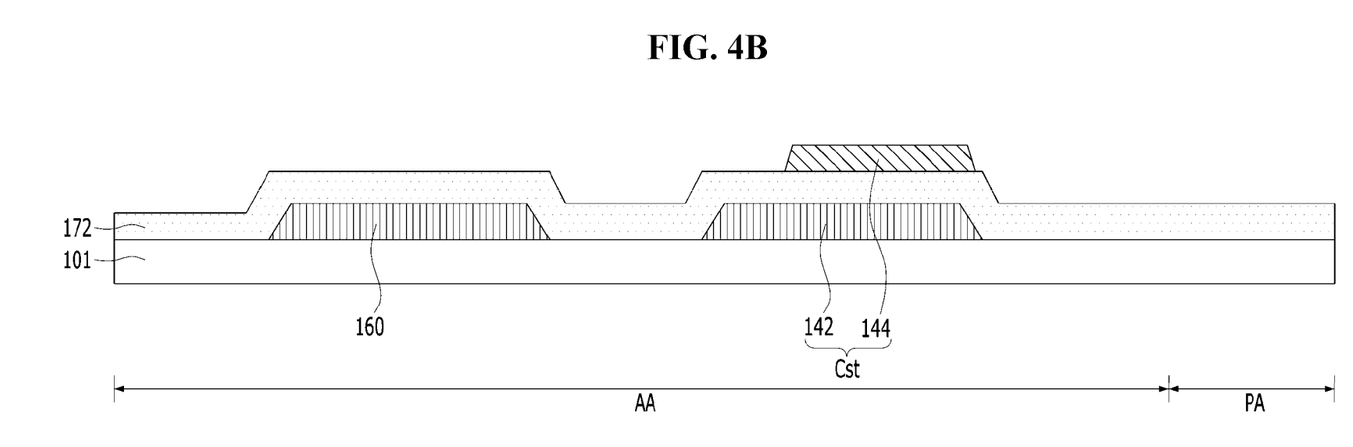

With reference to FIG. 4B, a first inorganic buffer layer 172 is formed on the substrate 101 provided with the storage lower electrode 142 and the low voltage supply line 160, and a storage upper electrode 144 is formed on the first inorganic buffer layer 172.

In more detail, the first inorganic buffer layer 172 is formed by depositing an inorganic insulating material, such as $SiO_x$ or $SiN_x$, on the entire surface of the substrate 101 provided with the storage lower electrode 142 and the low voltage supply line 160. Thereafter, a second conductive layer is deposited on the entire surface of the substrate 101 provided with the first inorganic buffer layer 172 and is then patterned through a photolithography process and an etching process, thus forming the storage upper electrode 144.

Figure 4C:
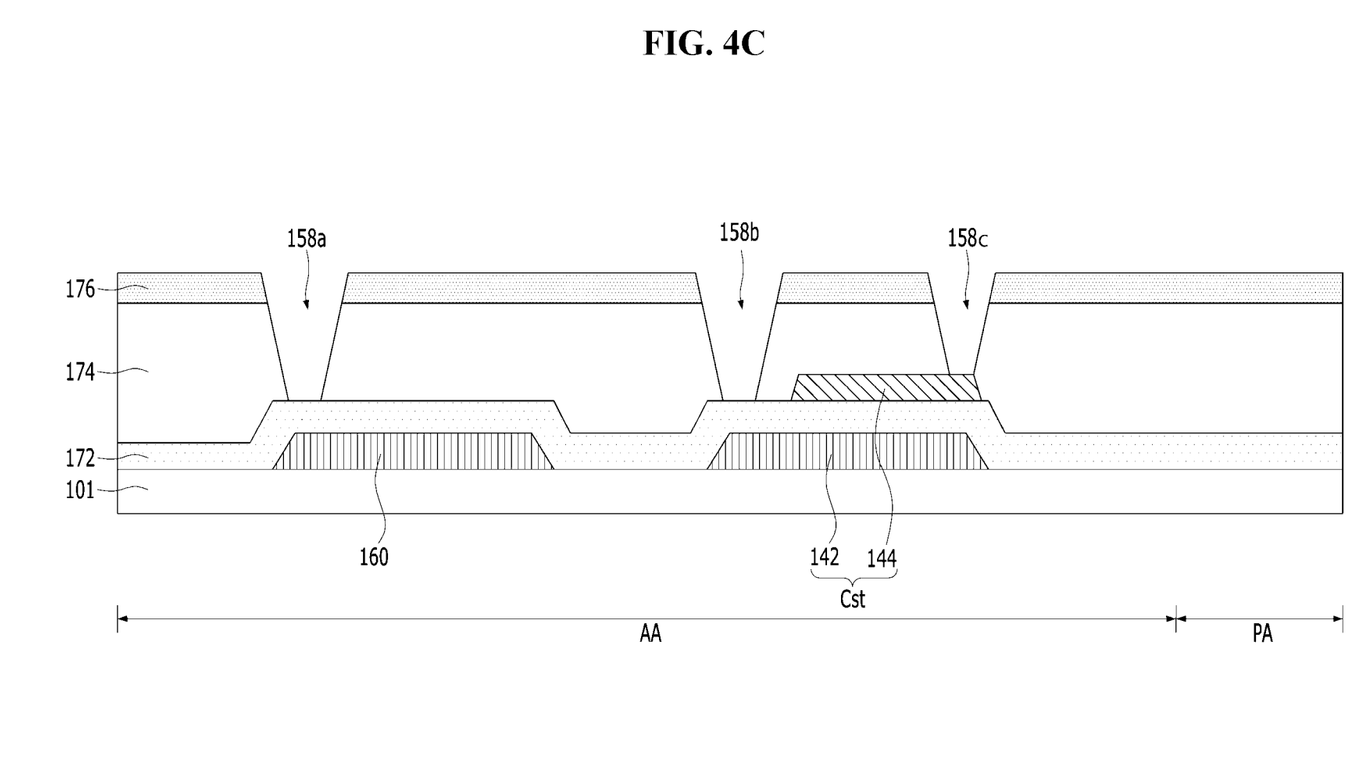

With reference to FIG. 4C, an organic buffer layer 174 and a second inorganic buffer layer 176 having first to third open holes 158a, 158b and 158c are formed on the substrate 101 provided with the storage upper electrode 144.

In more detail, the organic buffer layer 174 is formed by applying an organic insulating material, such as an acrylic resin, to the entire surface of the substrate 101 provided with the storage upper electrode 144, and the second inorganic buffer layer 176 is formed by depositing an inorganic insulating material, such as $SiO_x$ or $SiN_x$, on the entire surface of the organic buffer layer 174. Therefore, the organic buffer layer 174 and the second inorganic buffer layer 176 are patterned through a photolithography process and an etching process, thus forming the first to third open holes 158a, 158b and 158c. The first and second open holes 158a and 158b are formed through the organic buffer layer 174 and the second inorganic buffer layer 176 disposed on the low voltage supply line 160 and the storage lower electrode 142 and thus expose the first inorganic buffer layer 172 located on the low voltage supply line 160 and the storage lower electrode 142. The third open hole 158c is formed through the organic buffer layer 174 and the second inorganic buffer layer 176 disposed on the storage upper electrode 144 and thus exposes the storage upper electrode 144.

Figure 4D:
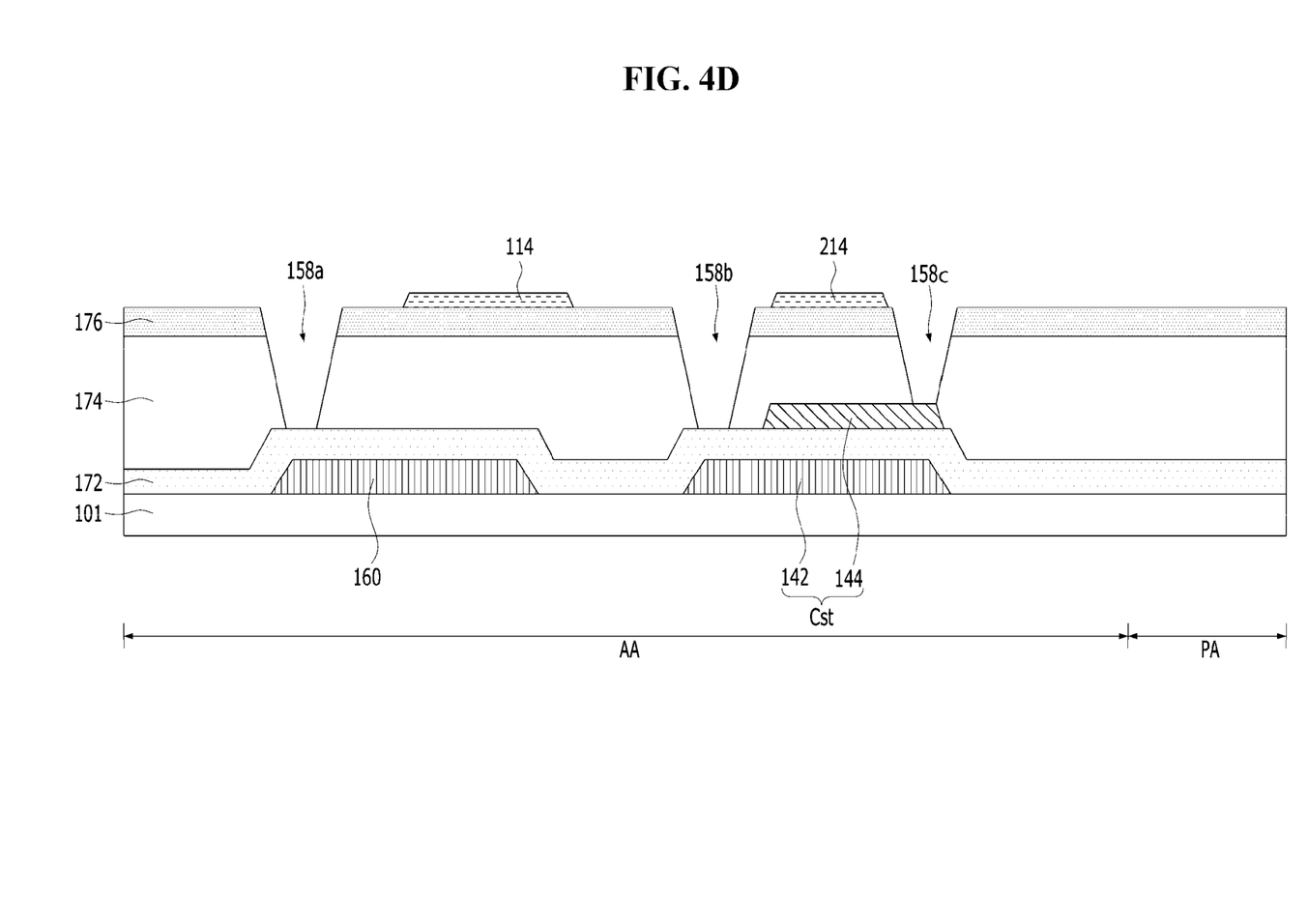

With reference to FIG. 4D, active layers 214 and 114 of switching and driving transistors TS and TD are formed on the substrate 101 provided with the organic buffer layer 174 and the second inorganic buffer layer 176 having the first to third open holes 158a, 158b and 158c.

In more detail, an amorphous silicon thin film is formed on the substrate 101 provided with the organic buffer layer 174 and the second inorganic buffer layer 176 through a method, such as low pressure chemical vapor deposition (LPCVD) or plasma enhanced chemical vapor deposition (PECVD). Thereafter, a polysilicon thin film is formed by crystallizing the amorphous silicon thin film. Thereafter, the polysilicon thin film is pattered through a photolithography process and an etching process, thus forming the active layers 214 and 114.

Figure 4E:
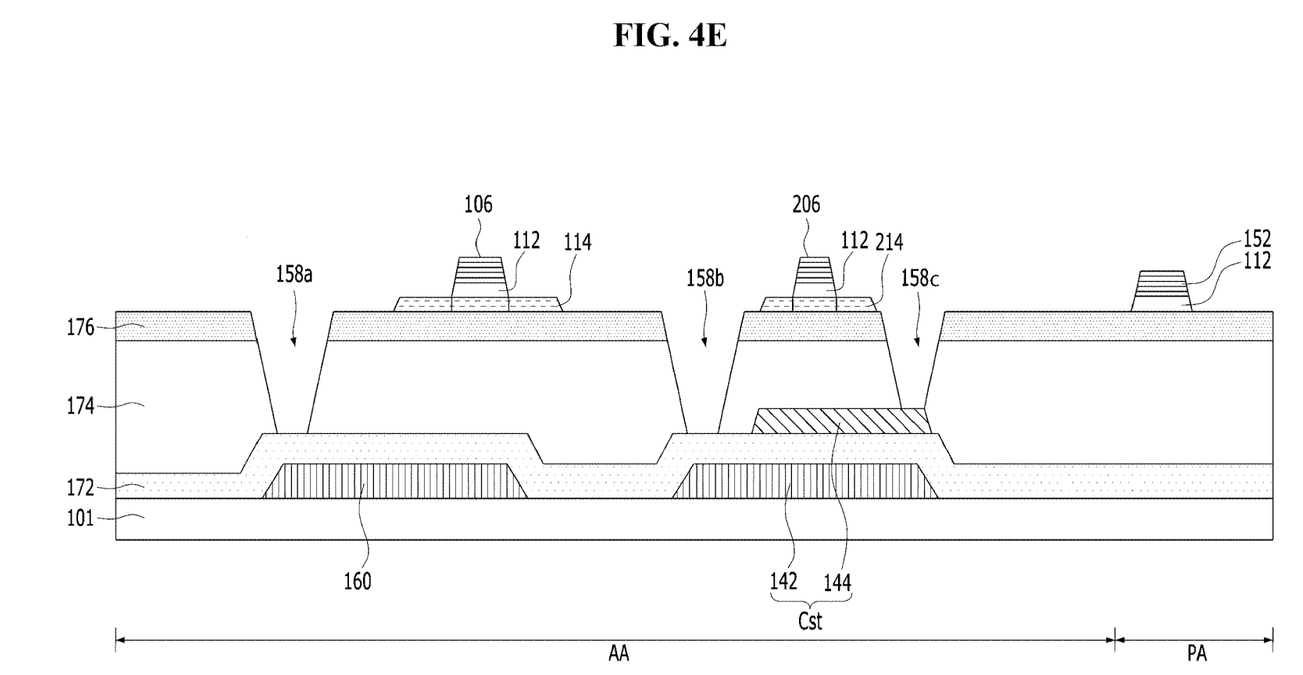

With reference to FIG. 4E, a gate insulating pattern 112 is formed on the substrate 101 provided with the active layers 214 and 114, and gate electrodes 206 and 106 of the switching and driving transistors TS and TD and a pad electrode 152 are formed on the gate insulating pattern 112.

In more detail, a gate insulating film is formed on the substrate 101 provided with the first and second active layers 214 and 114, and a third conductive layer is formed thereon through a deposition method, such as sputtering. An inorganic insulating material, such as $SiO_x$ or $SiN_x$, is used as the gate insulating film. The third conductive layer is formed to have a single layer structure including a metal selected from the group consisting of Mo, Ti, Cu, AlNd, Al, Cr and an alloy thereof or to have a multilayer structure including the same. Thereafter, the third conductive layer and the gate insulating film are simultaneously patterned through a photolithography process and an etching process, thereby forming the gate electrodes 206 and 106 of the switching and driving transistors TS and TD and the pad electrode 152 and forming the gate insulating pattern 112 thereunder to have the same shape as the gate electrodes 206 and 106 and the pad electrode 152. Thereafter, an $n^+$-type or $p^+$-type impurity is injected into the active layers 214 and 114 using the gate electrodes 206 and 106 as masks, thus forming source and drain regions of the active layers 214 and 114.

Figure 4F:
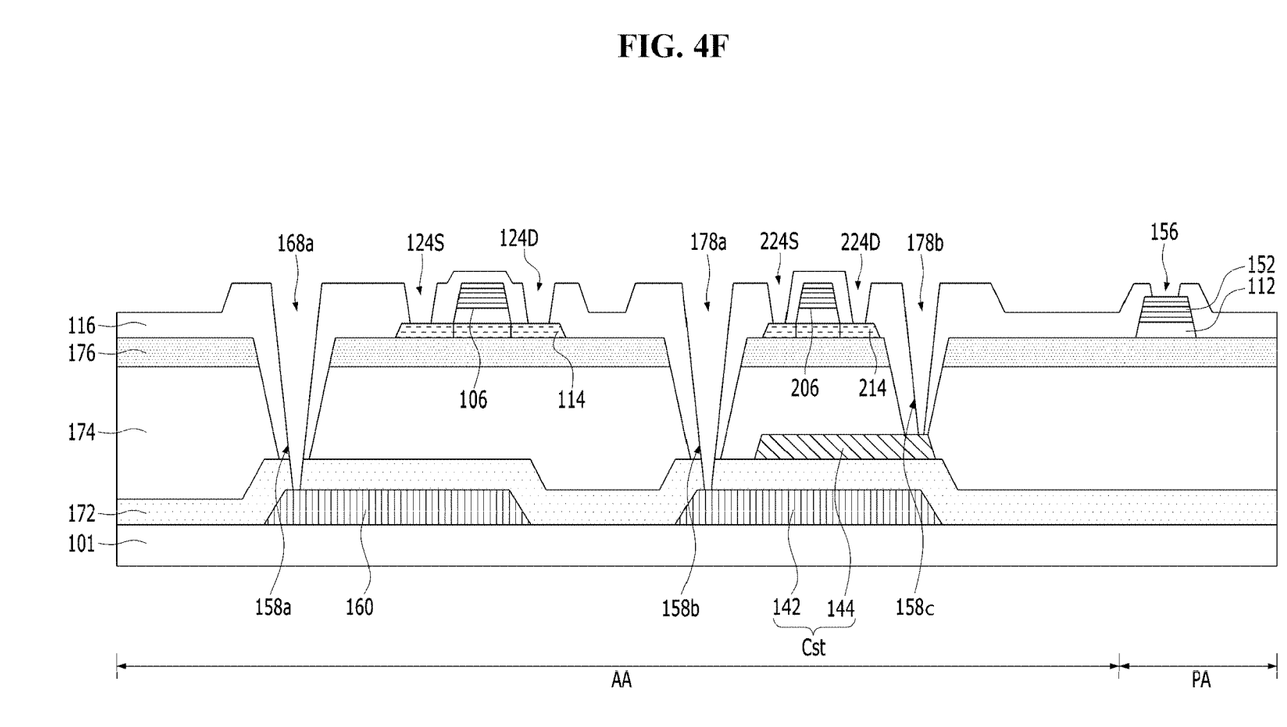

With reference to FIG. 4F, an interlayer insulating film 116 having source and drain contact holes 224S, 124S, 224D and 124D, a pad contact hole 156, first and second storage contact holes 178a and 178b and a first auxiliary contact hole 168a is formed on the substrate 101 provided with the gate electrodes 206 and 106 of the switching and driving transistors TS and TD and the pad electrode 152.

In more detail, the interlayer insulating film 116 is formed on the substrate 101 provided with the gate electrodes 206 and 106 and the pad electrode 152 through a deposition method, such as PECVD. Thereafter, the interlayer insulating film 116 and the first inorganic buffer layer 126 are patterned through a photolithography process and an etching process, thus forming the source and drain contact holes 224S, 124S, 224D and 124D, the pad contact hole 156, the first and second storage contact holes 178a and 178b and the first auxiliary contact hole 168a. Here, the source and drain contact holes 224S, 124S, 224D and 124D, the pad contact hole 156 and the second storage contact hole 178b are formed through the interlayer insulating film 116, and the first auxiliary contact hole 168a and the first storage contact hole 178a are formed through the interlayer insulating film 116 and the first inorganic buffer layer 172.

Figure 4G:
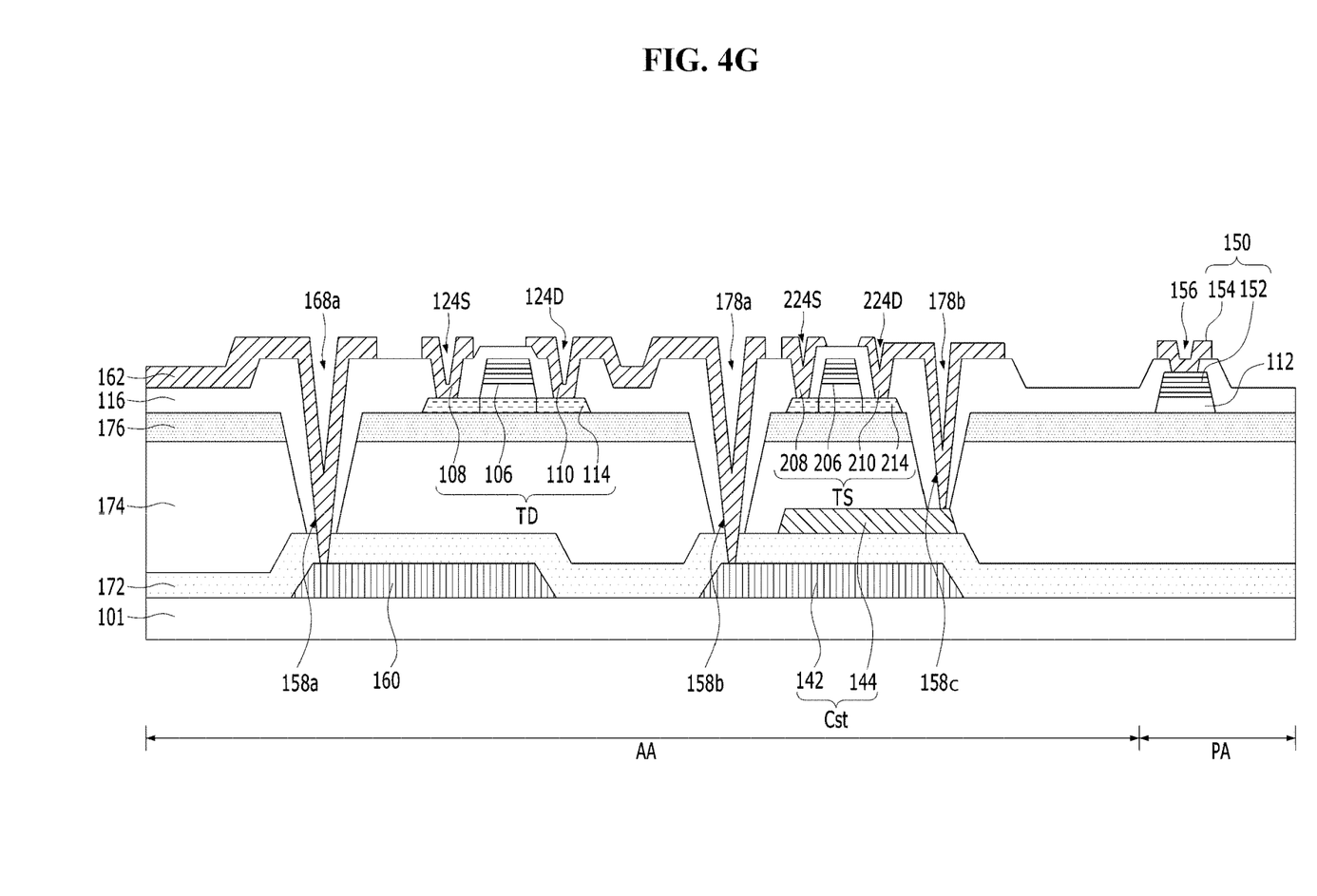

With reference to FIG. 4G, data lines DL, source electrodes 208 and 108 of the switching and driving transistors TS and TD, drain electrodes 210 and 110 of the switching and driving transistors TS and TD, a first auxiliary connection electrode 162 and a pad cover electrode 154 are formed on the interlayer insulating film 116 having the source and drain contact holes 224S, 124S, 224D and 124D, the pad contact hole 156, the first and second storage contact holes 178a and 178b and the first auxiliary contact hole 168a.

In more detail, a fourth conductive layer is formed on the interlayer insulating film 116 having the source and drain contact holes 224S, 124S, 224D and 124D, the pad contact hole 156, the first and second storage contact holes 178a and 178b and the first auxiliary contact hole 168a through a deposition method, such as sputtering. The fourth conductive layer is formed to have a single layer structure including a metal selected from the group consisting of Mo, Ti, Cu, AlNd, Al, Cr and an alloy thereof or to have a multilayer structure including the same. Thereafter, the fourth conductive layer is patterned through a photolithography process and an etching process, thus forming the data lines DL, the source electrodes 208 and 108, the drain electrodes 210 and 110, the first auxiliary connection electrode 162 and the pad cover electrode 154.

Figure 4H:
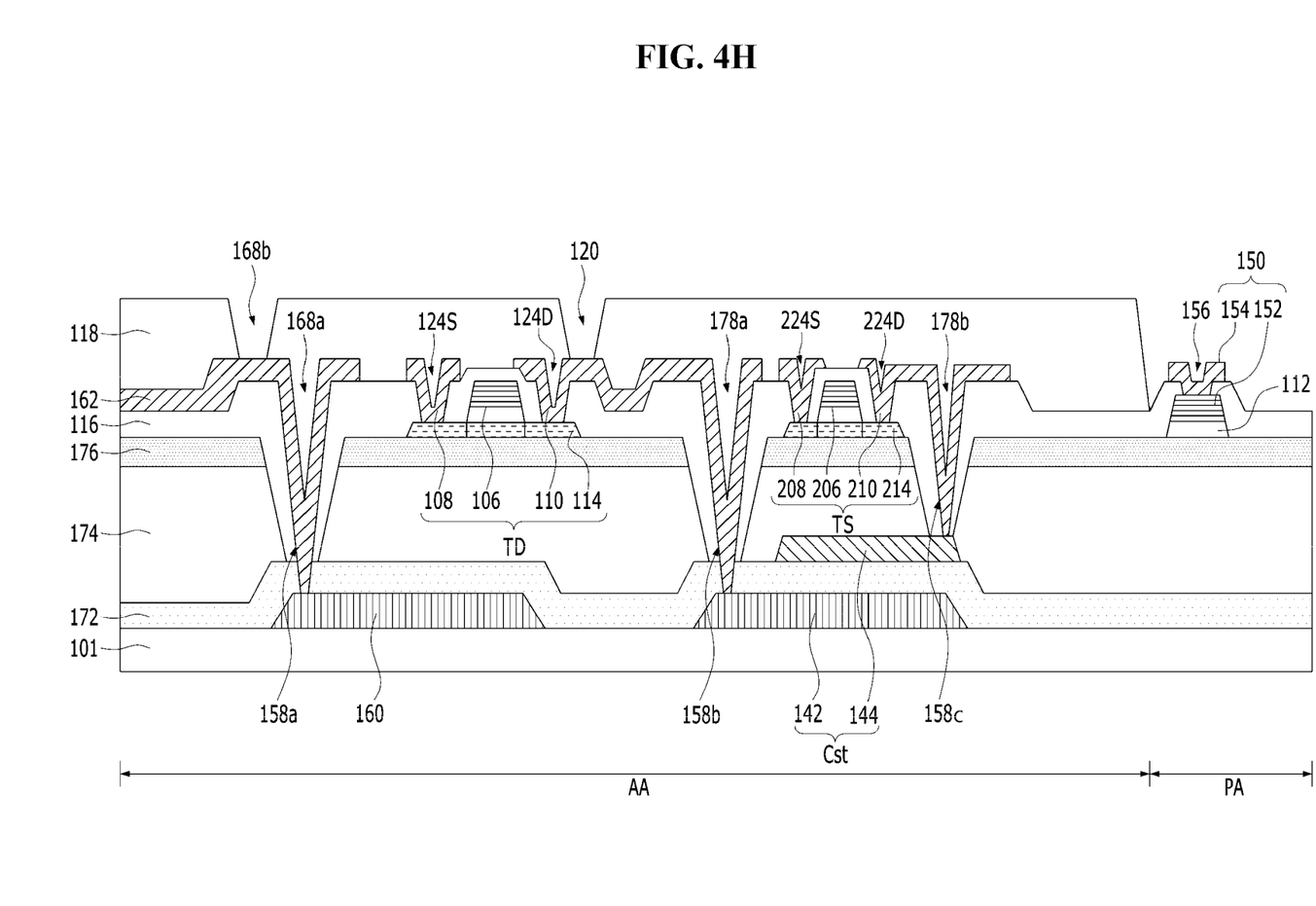

With reference to FIG. 4H, a planarization layer 118 having a second auxiliary contact hole 168b and a pixel contact hole 120 is formed on the substrate 101 provided with the source electrodes 208 and 108, the drain electrodes 210 and 110, the first auxiliary connection electrode 162 and the pad cover electrode 154.

In more detail, the planarization layer 118 is formed on the interlayer insulating film 116 provided with the source electrodes 208 and 108, the drain electrodes 210 and 110, the first auxiliary connection electrode 162 and the pad cover electrode 154 through a coating process. The planarization layer 118 uses an organic insulating material, such as photoacryl. Thereafter, the planarization layer 118 is patterned through a photolithography process and an etching process, thus forming the pixel contact hole 120 and the second auxiliary contact hole 168b. The pixel contact hole 120 is formed through the planarization layer 118 and thus exposes the drain electrode 110 of the driving transistor TD, and the second auxiliary contact hole 168b is formed through the planarization layer 118 and thus exposes the first auxiliary connection electrode 162. Further, the planarization layer 118 is removed from the upper surface of the pad cover electrode 154, thus exposing the pad cover electrode 154 to the outside.

Figure 4I:
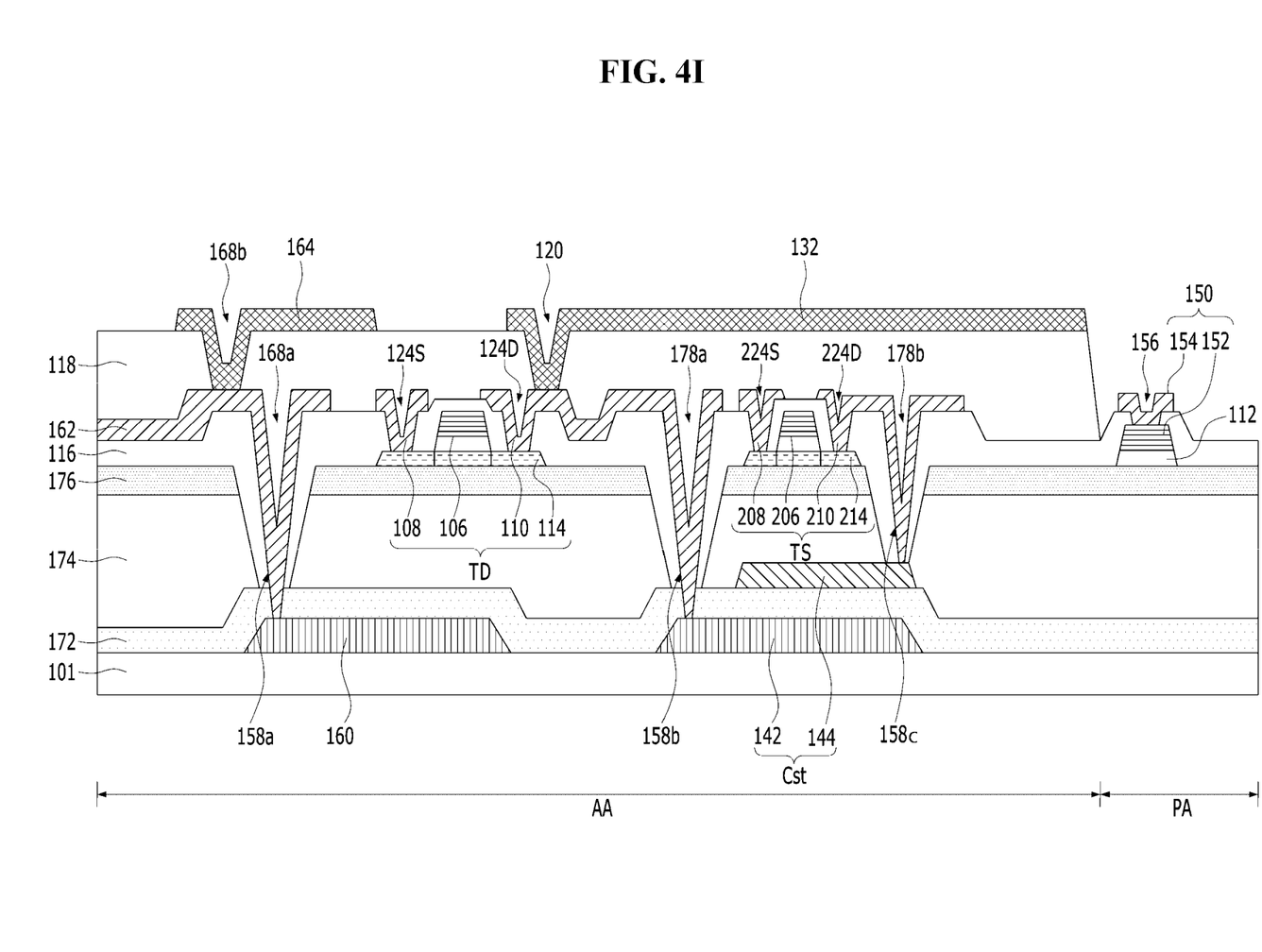

With reference to FIG. 4I, an anode 132 and a second auxiliary connection electrode 164 are formed on the substrate 101 provided with the planarization layer 118 having the pixel contact hole 120 and the second auxiliary contact hole 168b.

In more detail, a photosensitive film is applied to the entire surface of the substrate 101 provided with the planarization layer 118 and is then patterned through a photolithography process, thus forming a photosensitive protective film (not shown) to cover pad parts. Thereafter, a fifth conductive layer is applied to the entire surface of the substrate 101 provided with the photosensitive protective film and is then patterned through a photolithography process and an etching process, thus forming the anode 132 and the second auxiliary connection electrode 164. The photosensitive protective film together with a photosensitive film used in patterning of the fifth conductive layer is removed through a stripping process.

Figure 4J:
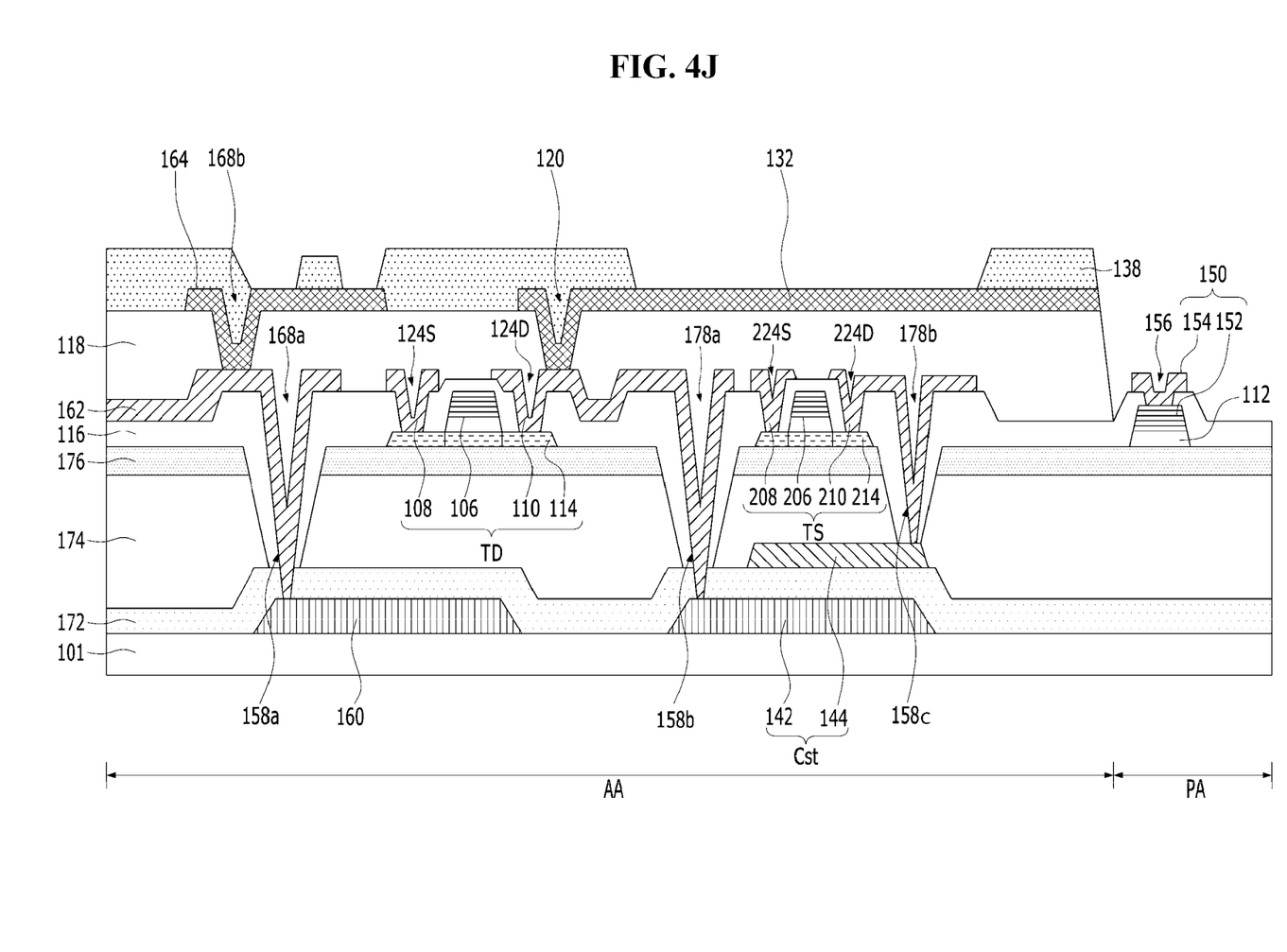

With reference to FIG. 4J, a bank 138 is formed on the substrate 101 provided with the anode 132 and the second auxiliary connection electrode 164.

In more detail, a photosensitive film for banks is applied to the entire surface of the substrate 101 provided with the anode 132 and the second auxiliary connection electrode 164 and is then patterned through a photolithography process, thus forming the bank 138.

Figure 4K:
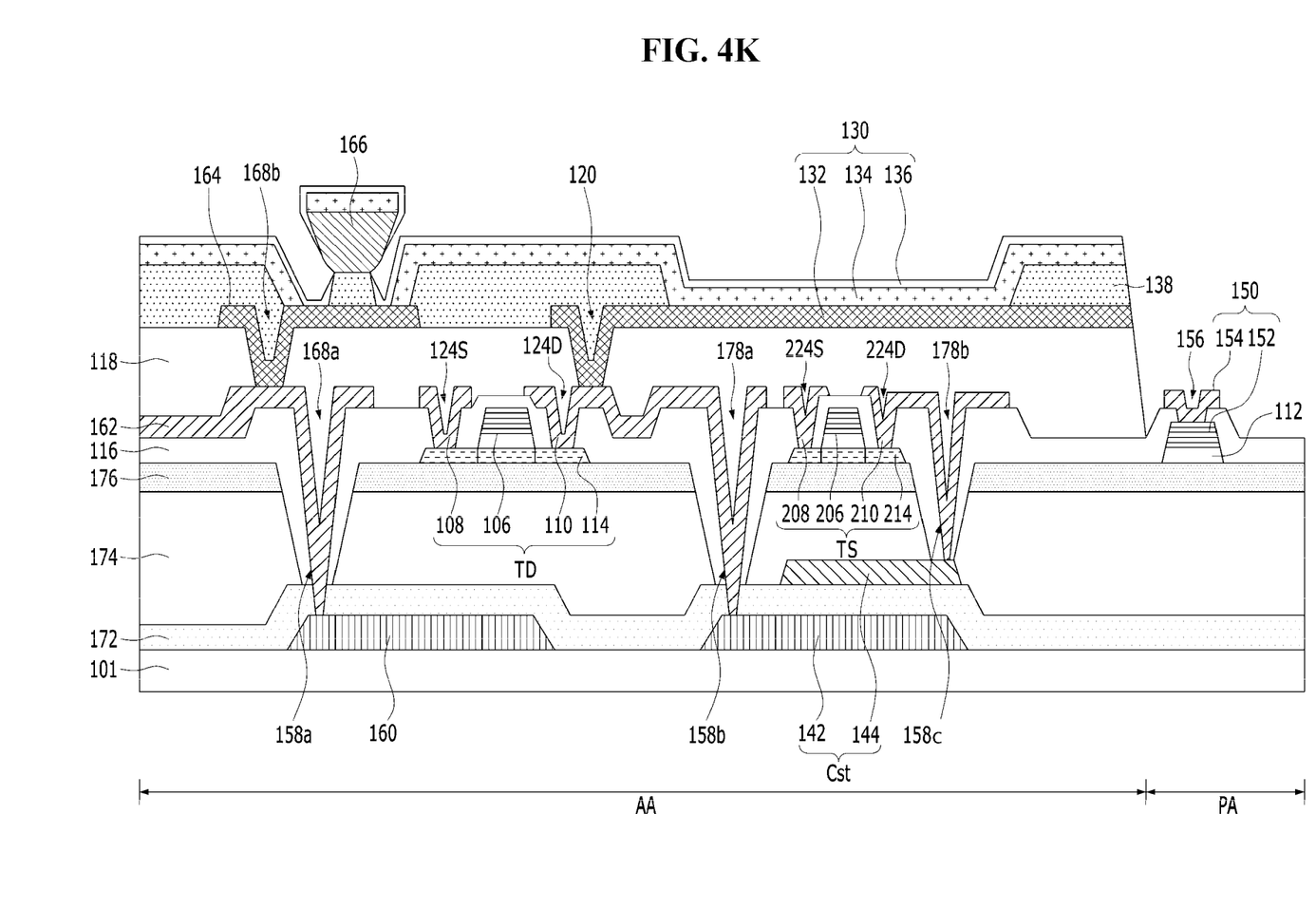

With reference to FIG. 4K, a diaphragm 166, a light emitting stack 134 and a cathode 136 are sequentially formed on the substrate 101 provided with the bank 138.

In more detail, a photosensitive film for diaphragms is applied to the substrate 101 provided with the bank 138 and is then patterned through a photolithography process, thus forming a diaphragm 166 having a reverse tapered shape. Thereafter, the organic light emitting stack 134 and the cathode 136 using a sixth conductive layer are sequentially formed in the active area AA of the substrate 101 except for the pad area PA through a deposition process using a shadow mask.

Although the organic light emitting display device is exemplarily described, the present invention is applicable to all display devices including storage capacitors and transistors. For example, in a liquid crystal display device, a storage capacitor and thin film transistors may vertically overlap each other with at least one buffer layer including an organic buffer layer interposed therebetween.

As apparent from the above description, in an organic light emitting display device in accordance with the present invention, at least one of a switching transistor, a driving transistor and a data line vertically overlaps at least one of a storage capacitor, a low voltage supply line and a high voltage supply line with at least one buffer layer including an organic buffer layer interposed therebetween. Therefore, a capacitor area, in which the storage capacitor is disposed, vertically overlaps an emission area and a transistor area and signal lines vertically overlap each other, thus assuring a sufficient process margin, implementing high resolution and improving yield.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   storage capacitors disposed on a substrate;
   at least one buffer layer disposed on the storage capacitors;
   a plurality of transistors overlapping each of the storage capacitors with at least one buffer layer interposed therebetween;
   light emitting elements connected to the transistors;
   a low voltage supply line connected to the light emitting elements; and
   a high voltage supply line and data lines,
   wherein at least one of the low voltage supply line and the high voltage supply line overlaps one of the data lines with the at least one buffer layer interposed therebetween.

2. The organic light emitting display device according to claim 1, wherein the at least one buffer layer includes an organic buffer layer formed of an organic insulating material.

3. The organic light emitting display device according to claim 1, wherein the at least one buffer layer includes:
   a first inorganic buffer layer disposed on the substrate;
   an organic buffer layer disposed on the first inorganic buffer layer and formed of an organic insulating material; and
   a second inorganic buffer layer disposed on the organic buffer layer to have the same line width as the organic buffer layer.

4. The organic light emitting display device according to claim 3, wherein each of the storage capacitors includes:
   a storage lower electrode disposed between the substrate and the first inorganic buffer layer; and
   a storage upper electrode disposed on the first inorganic buffer layer.

5. The organic light emitting display device according to claim 1,
   wherein the data lines are disposed in parallel with at least one of the high voltage supply line and the low voltage supply line.

6. The organic light emitting display device according to claim 5, wherein the transistors include:
   a driving transistor connected to the light emitting element; and
   a switching transistor connected to the driving transistor,
   wherein:
   the switching transistor overlaps one of the low voltage supply line and the storage capacitor with the at least one buffer layer interposed therebetween; and
   the driving transistor overlaps the other of the low voltage supply line and the storage capacitor with the at least one buffer layer interposed therebetween.

7. A method of manufacturing an organic light emitting display device, comprising:
   forming storage capacitors disposed on a substrate;
   forming at least one buffer layer disposed on the storage capacitors;
   forming a plurality of transistors overlapping each of the storage capacitors with the at least one buffer layer interposed therebetween;
   forming light emitting elements connected to the transistors;
   forming a low voltage supply line connected to the light emitting elements; and
   forming a high voltage supply line and data lines,
   wherein at least one of the low voltage supply line and the high voltage supply line overlaps one of the data lines with the at least one buffer layer interposed therebetween.

8. The method according to claim 7, wherein, in the formation of the at least one buffer layer, an organic buffer layer formed of an organic insulating material is formed on the substrate.

9. The method according to claim 7, wherein the formation of the at least one buffer layer includes:
   forming a first inorganic buffer layer on the substrate;
   forming an organic buffer layer formed of an organic insulating material on the first inorganic buffer layer; and
   forming a second inorganic buffer layer on the organic buffer layer to have the same line width as the organic buffer layer.

10. The method according to claim 9, wherein the formation of the storage capacitors includes:
    forming storage lower electrodes on the substrate; and
    forming storage upper electrodes on the first inorganic buffer layer.

11. The method according to claim 10, further comprising:
    forming the low voltage supply line and the high voltage supply line together with the formation of the storage lower electrodes,
    wherein at least one of the low voltage supply line and the high voltage supply line overlaps one of the data lines, wherein the one of the data lines is disposed in parallel with the at least one of the low voltage supply line and the high voltage supply line, with the at least one buffer layer interposed therebetween.

12. The method according to claim 11, wherein, in the formation of the transistors, a driving transistor connected to the light emitting element and a switching transistor connected to the driving transistor are formed, wherein:
    the switching transistor overlaps one of the low voltage supply line and the storage capacitor with the at least one buffer layer interposed therebetween; and
    the driving transistor overlaps the other of the low voltage supply line and the storage capacitor with the at least one buffer layer interposed therebetween.

* * * * *